(12) United States Patent
Lin et al.

(10) Patent No.: US 9,941,386 B2
(45) Date of Patent: Apr. 10, 2018

(54) SEMICONDUCTOR DEVICE STRUCTURE WITH FIN STRUCTURE AND METHOD FOR FORMING THE SAME

(71) Applicant: TAIWAN SEMICONDUCTOR MANUFACTURING CO., LTD., Hsinchu (TW)

(72) Inventors: Chung-Wei Lin, Toufen Township, Miaoli County (TW); Tsung-Yu Chiang, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 37 days.

(21) Appl. No.: 15/170,294

(22) Filed: Jun. 1, 2016

(65) Prior Publication Data
US 2017/0352740 A1 Dec. 7, 2017

(51) Int. Cl.
*H01L 29/76* (2006.01)
*H01L 29/66* (2006.01)
(Continued)

(52) U.S. Cl.
CPC ........... *H01L 29/66545* (2013.01); *H01L 21/823431* (2013.01); *H01L 21/823481* (2013.01); *H01L 21/823814* (2013.01); *H01L 21/823821* (2013.01); *H01L 21/823878* (2013.01); *H01L 27/0886* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/66795* (2013.01); *H01L 29/785* (2013.01); *H01L 29/7848* (2013.01); *H01L 29/7851* (2013.01)

(58) Field of Classification Search
CPC ..... H01L 21/823431; H01L 21/823481; H01L 27/0886; H01L 29/66795; H01L 29/785; H01L 29/7851
See application file for complete search history.

(56) References Cited

U.S. PATENT DOCUMENTS 7,667,271 B2 2/2010 Yu et al.
7,910,453 B2 3/2011 Xu et al.
(Continued)

*Primary Examiner* — Matthew E Warren
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first fin structure and a second fin structure over the substrate. There is a gap between the first fin structure and the second fin structure. The semiconductor device structure includes an isolation structure having a thin portion and a thick portion. A first upper portion of the first fin structure and a second upper portion of the second fin structure protrude from the thin portion. The thick portion is partially between the first upper portion and the second upper portion. The semiconductor device structure includes a dummy gate electrode over the thick portion, the first upper portion, and the second upper portion. The semiconductor device structure includes a gate electrode over the first fin structure and the thin portion.

20 Claims, 19 Drawing Sheets

(51) Int. Cl.

| | | |
|---|---|---|
| *H01L 29/08* | (2006.01) | |
| *H01L 29/161* | (2006.01) | |
| *H01L 29/16* | (2006.01) | |
| *H01L 29/165* | (2006.01) | |
| *H01L 29/24* | (2006.01) | |
| *H01L 29/267* | (2006.01) | |
| *H01L 29/78* | (2006.01) | |
| *H01L 29/06* | (2006.01) | |
| *H01L 27/092* | (2006.01) | |
| *H01L 21/8238* | (2006.01) | |
| *H01L 27/088* | (2006.01) | |
| *H01L 21/8234* | (2006.01) | |

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2014/0001574 A1 | 1/2014 | Chen et al. |
| 2014/0110755 A1 | 4/2014 | Colinge |
| 2014/0151812 A1 | 6/2014 | Liaw |
| 2015/0147860 A1* | 5/2015 | Kim ............ H01L 29/66795 438/283 |
| 2016/0079125 A1* | 3/2016 | Kim ............ H01L 21/82343 438/283 |

\* cited by examiner

US 9,941,386 B2

SEMICONDUCTOR DEVICE STRUCTURE WITH FIN STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-2 to 1L-2 are cross-sectional views illustrating the semiconductor device structure along a sectional line I-I' in FIGS. 1A-1 to 1L-1, in accordance with some embodiments.

FIGS. 1C-3, 1E-3, 1J-3, and 1L-3 are perspective views of the semiconductor device structure of FIGS. 1C-1, 1E-1, 1J-1, and 1L-1, in accordance with some embodiments.

FIGS. 1F-3, 1G-3, and 1L-4 are cross-sectional views illustrating the semiconductor device structure along a sectional line II-II' in FIGS. 1F-1, 1G-1, and 1L-1, in accordance with some embodiments.

DETAILED DESCRIPTION

Figures 1, 1A:
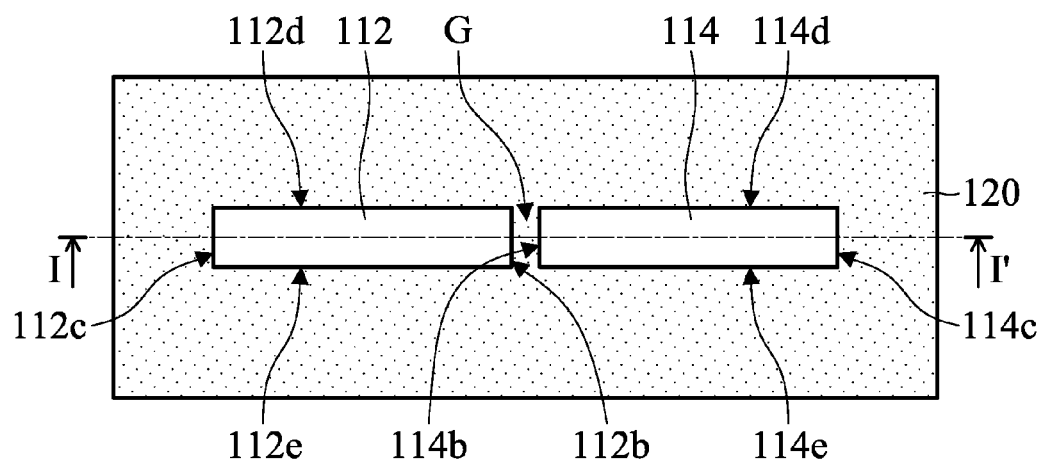
FIGS. 1A-1 to 1L-1 are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A, 2:
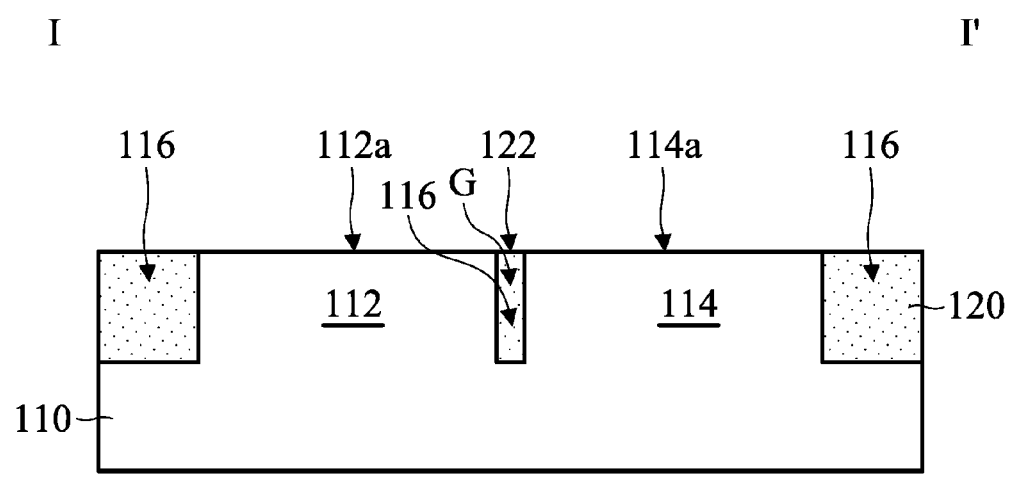
Figures 1, 1B:
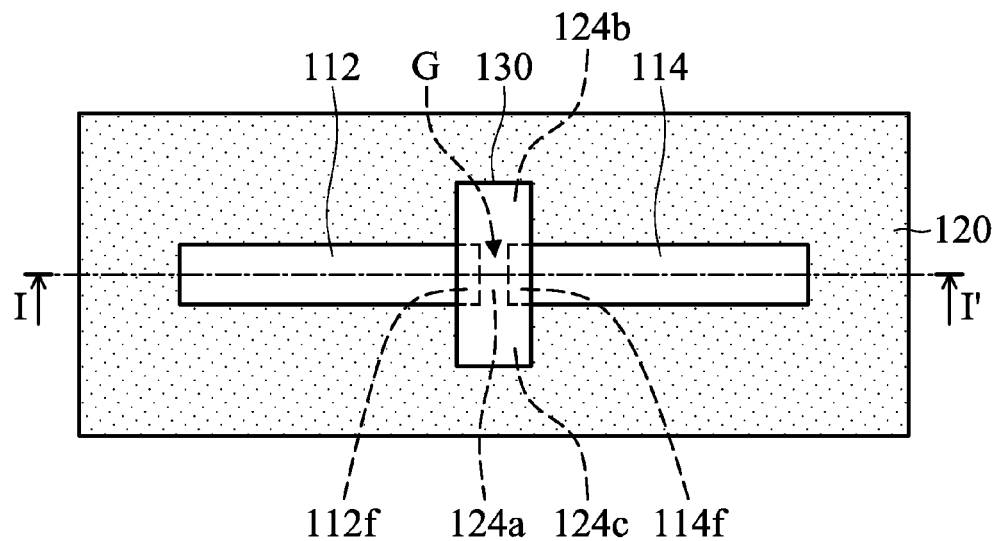
Figures 1, 1B, 2:
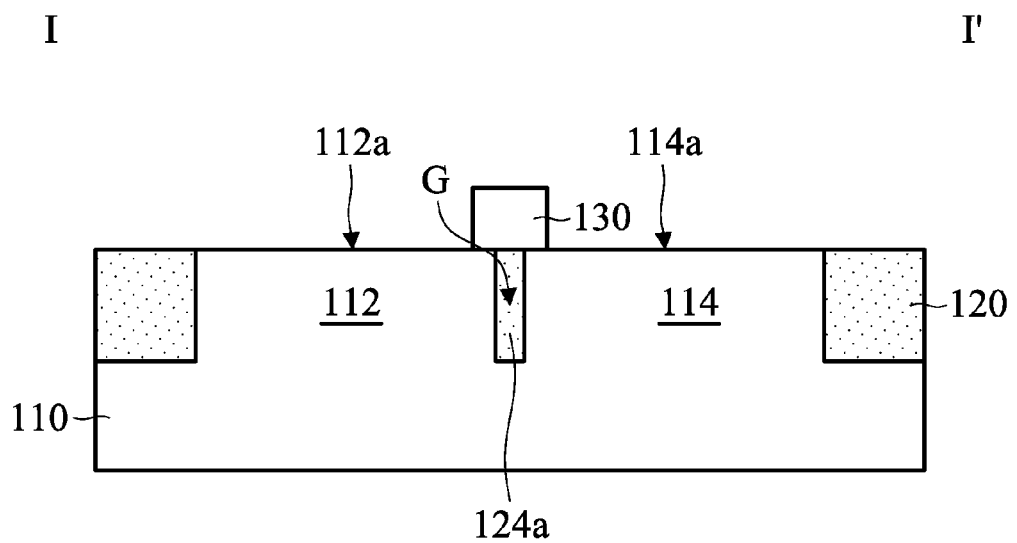
Figures 1, 1C:
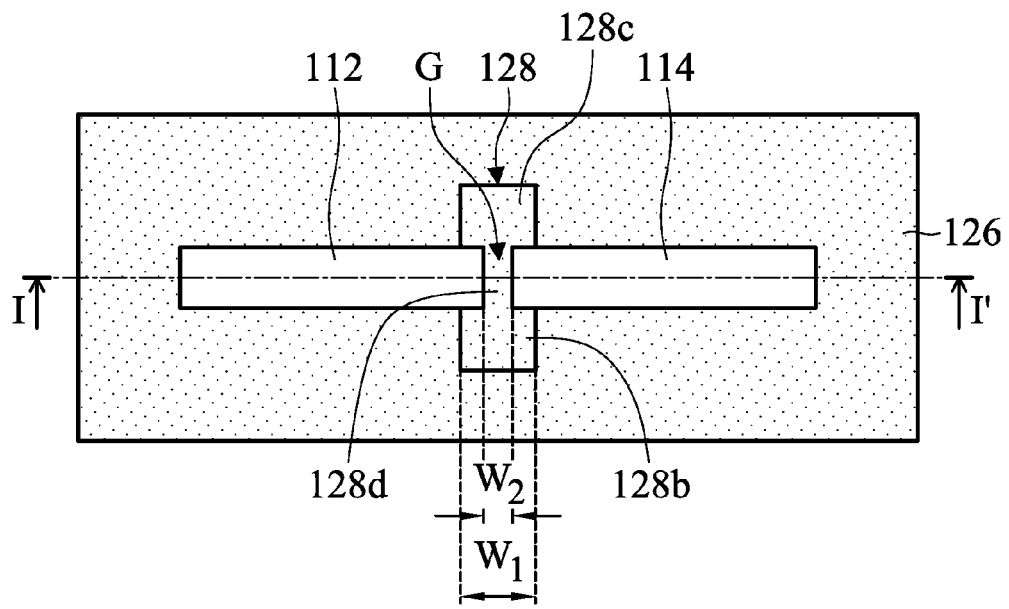
Figures 1, 1C, 2:
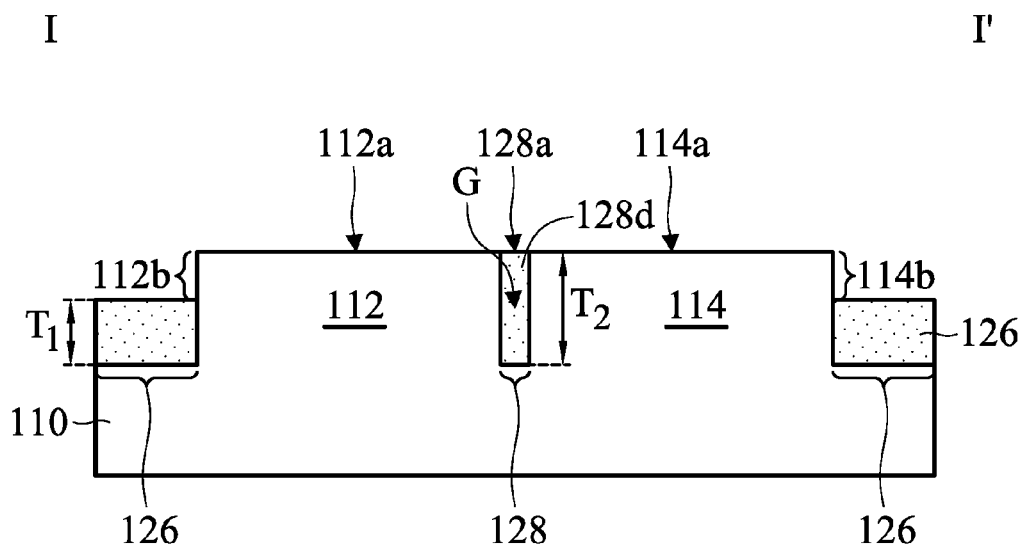
Figures 1, 1C, 2, 3:
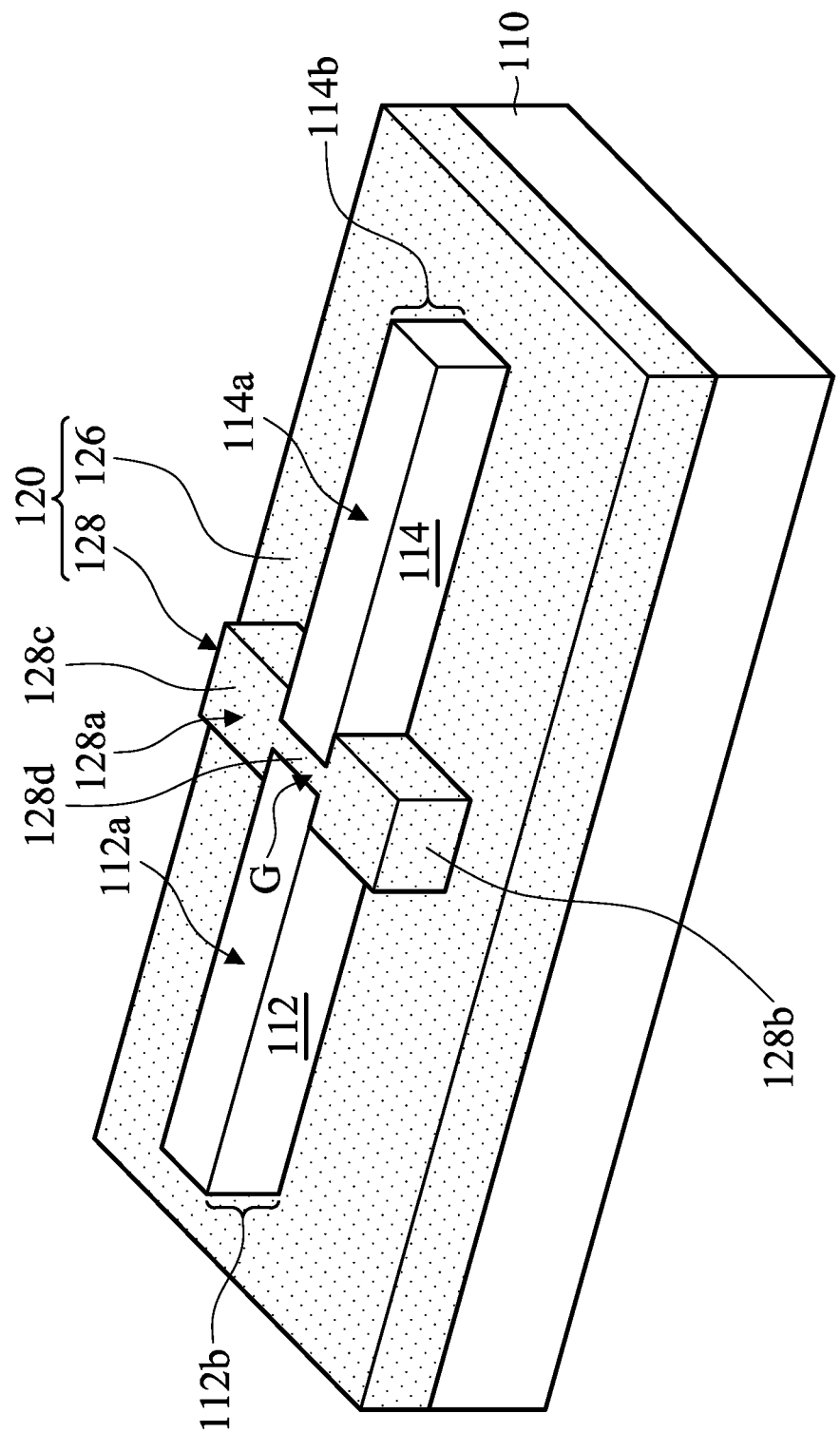
Figures 1, 1D:
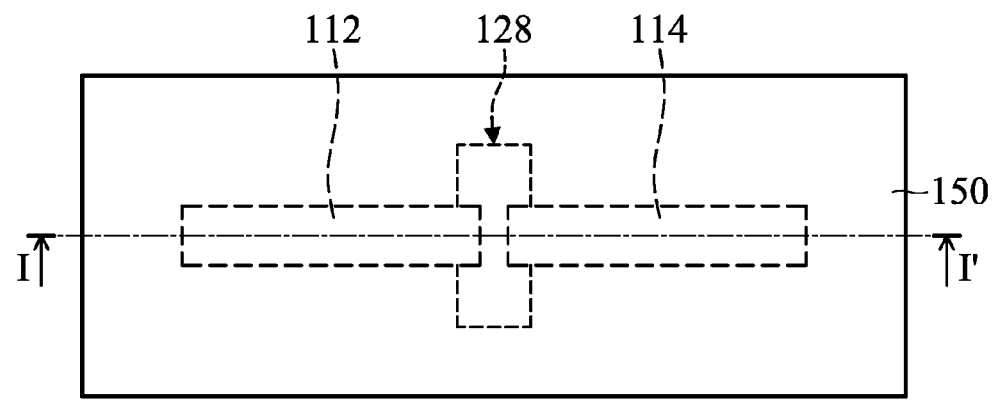
Figures 1, 1D, 2:
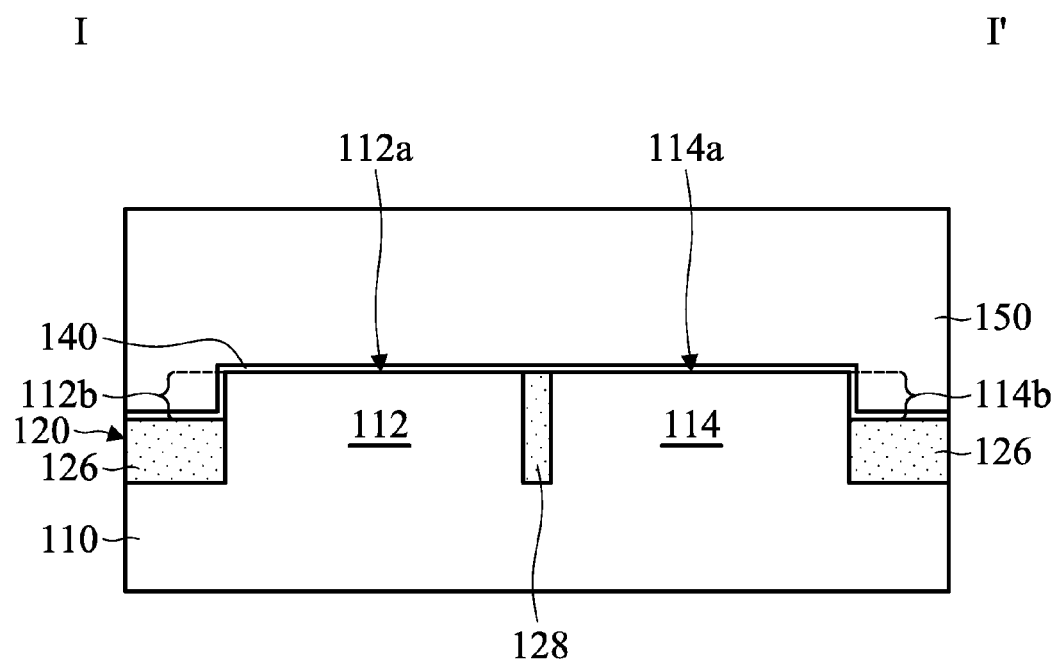
Figures 1, 1E:
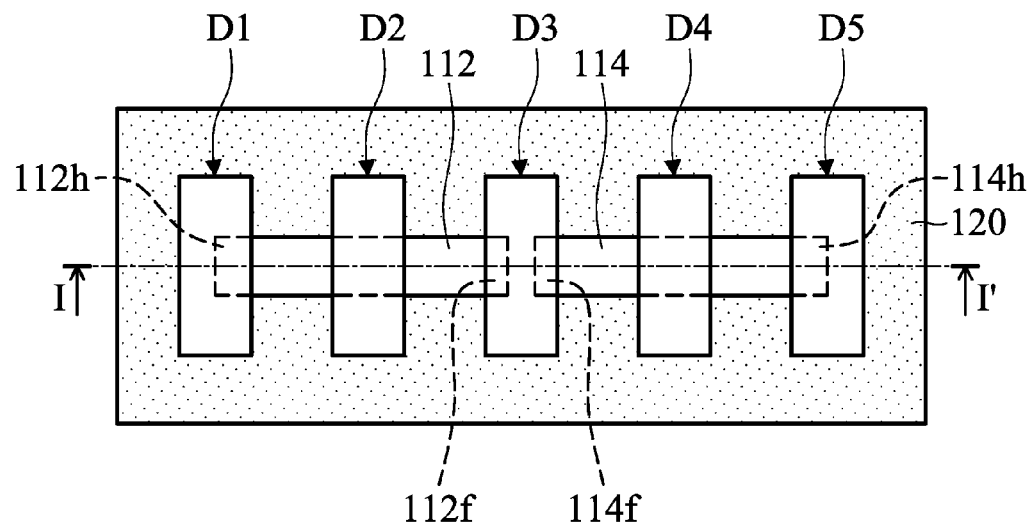
Figures 1, 1E, 2:
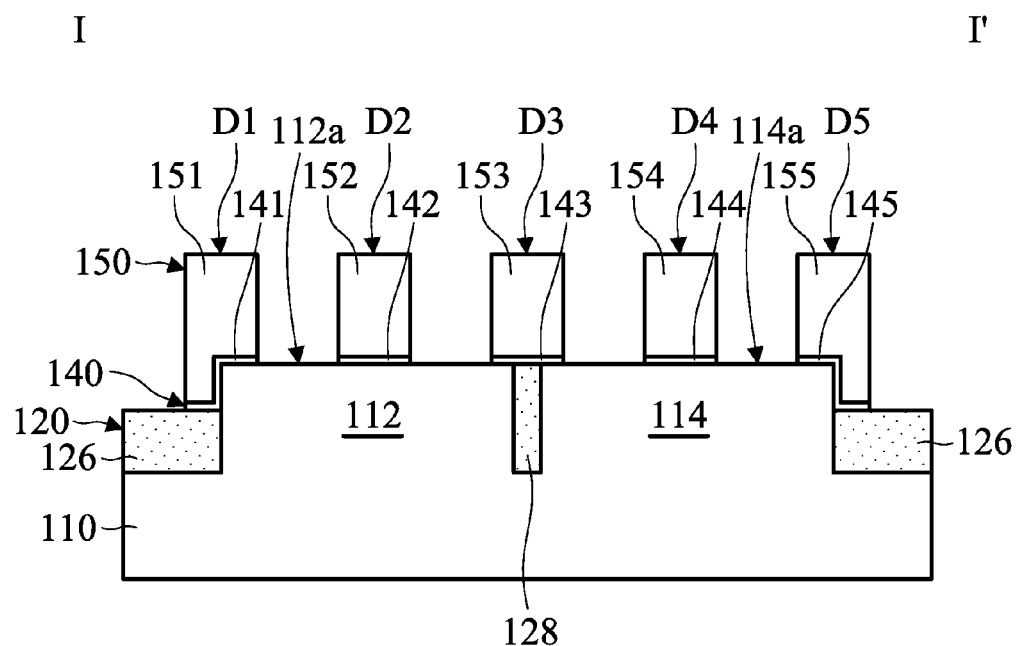
Figures 1, 1E, 2, 3:
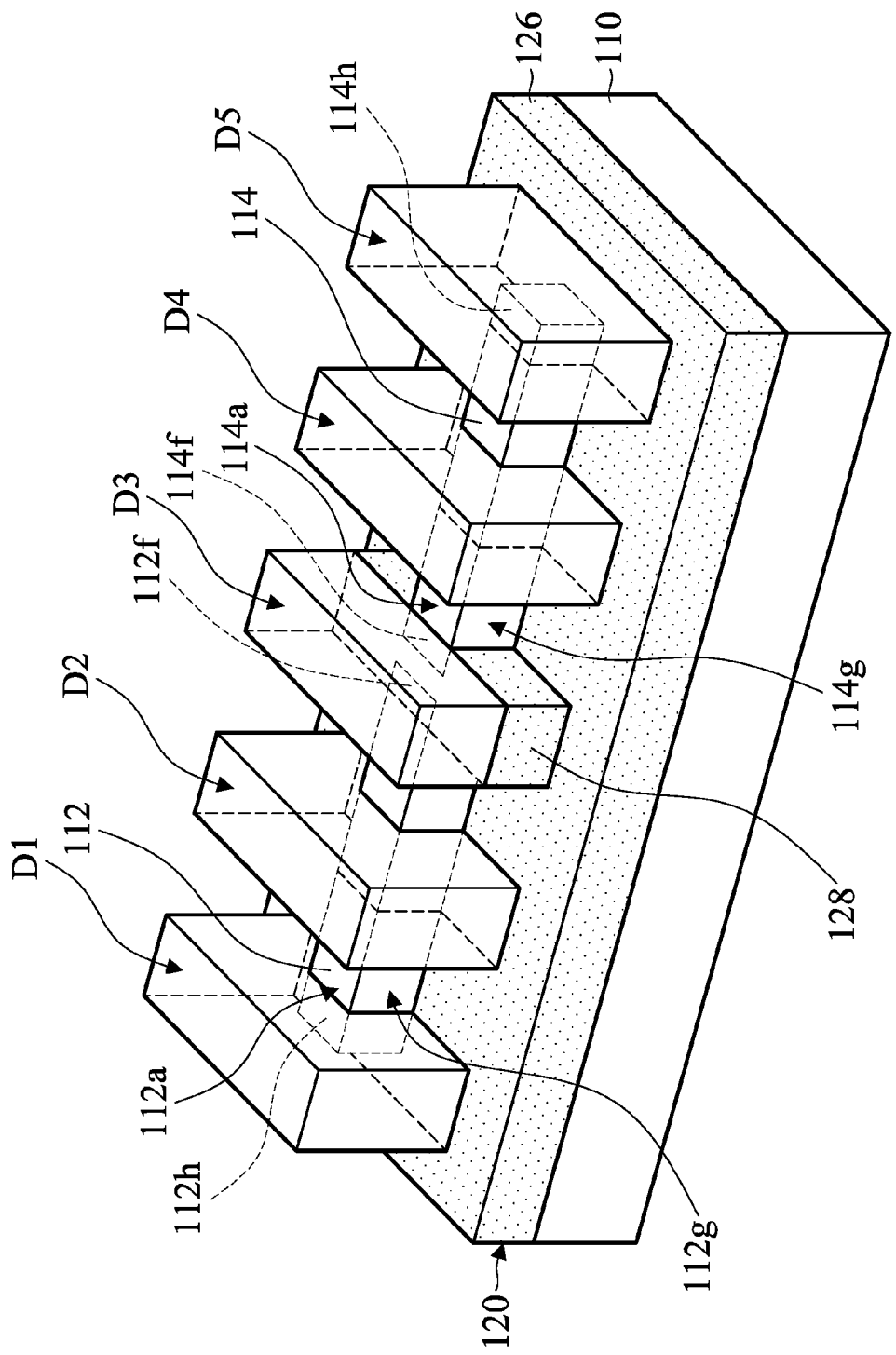
Figures 1, 1F:
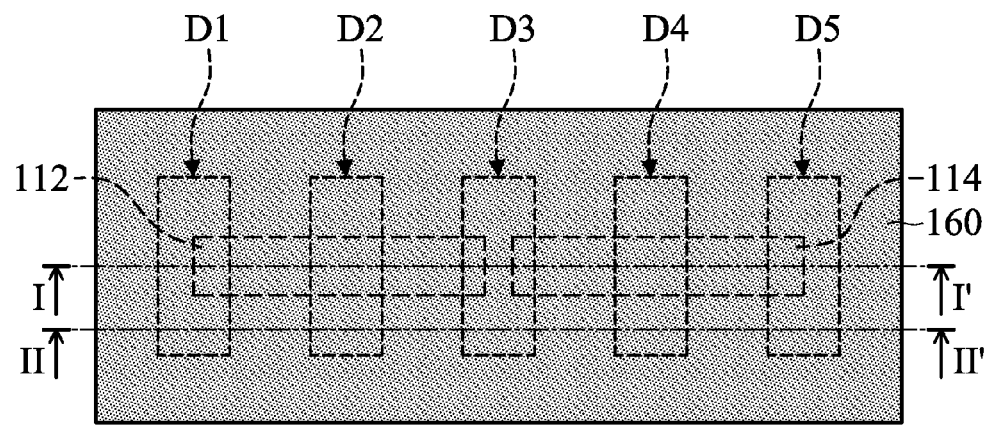
Figures 1, 1F, 2:
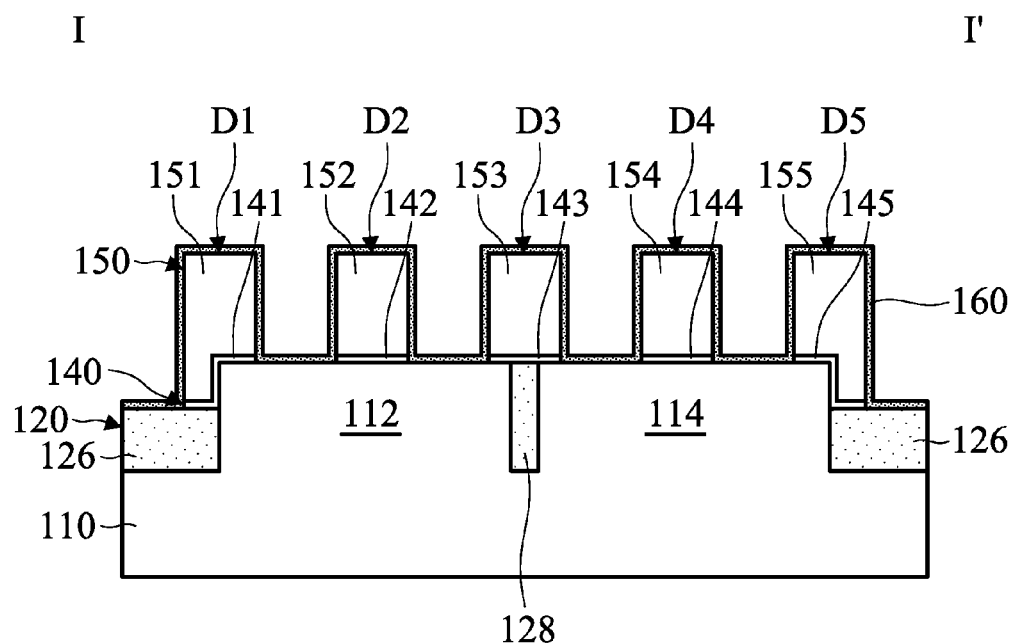
Figures 1, 1F, 2, 3:
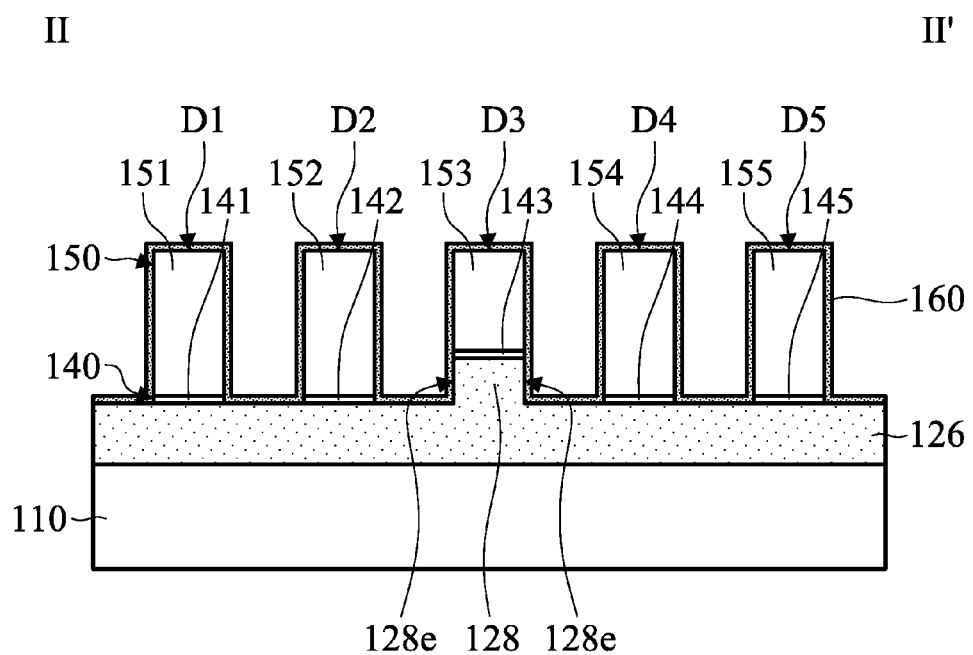
Figures 1, 1G:
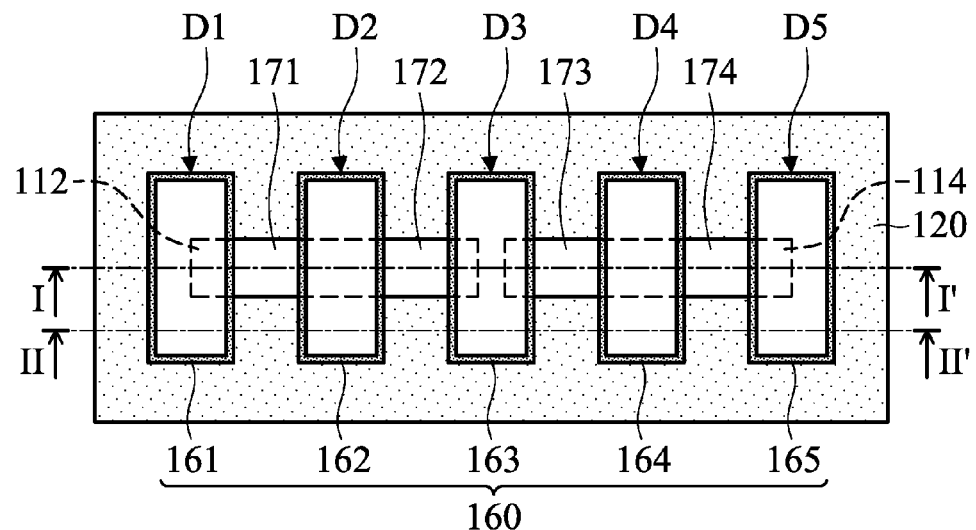
Figures 1, 1G, 2:
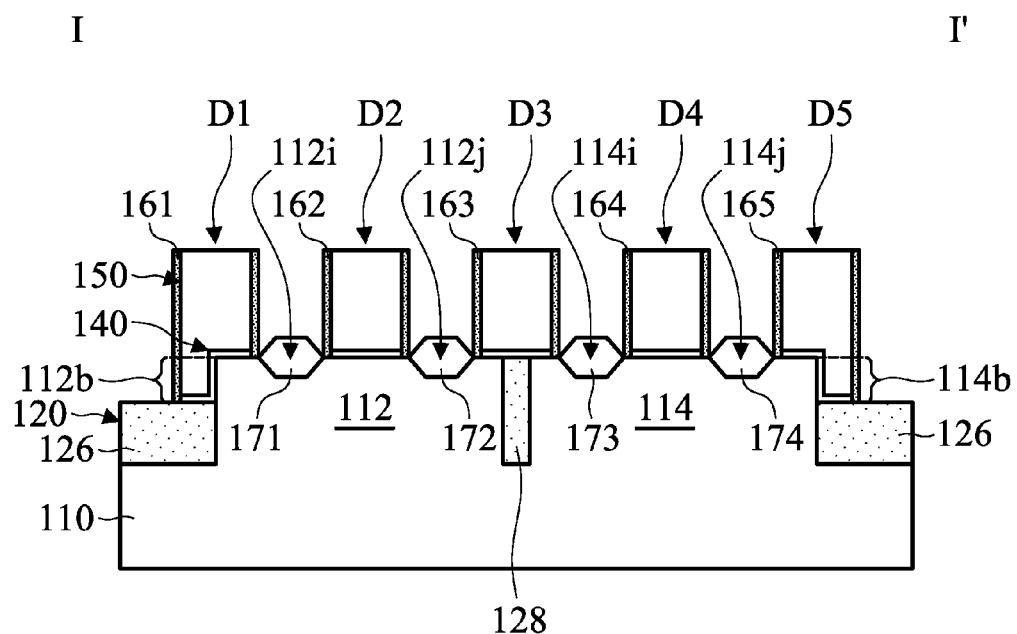
Figures 1, 1G, 2, 3:
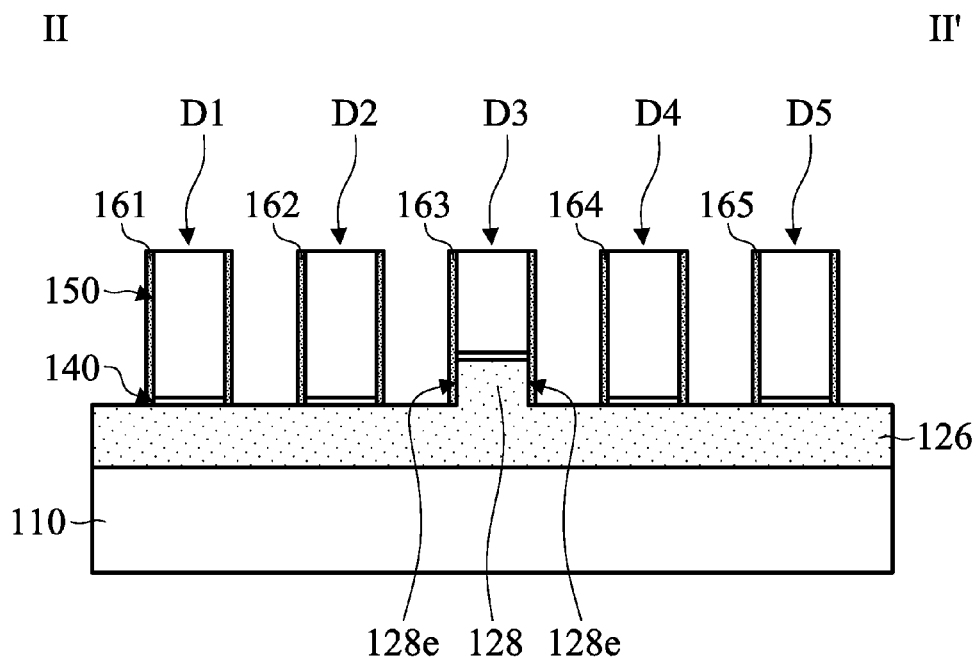
Figures 1, 1H:
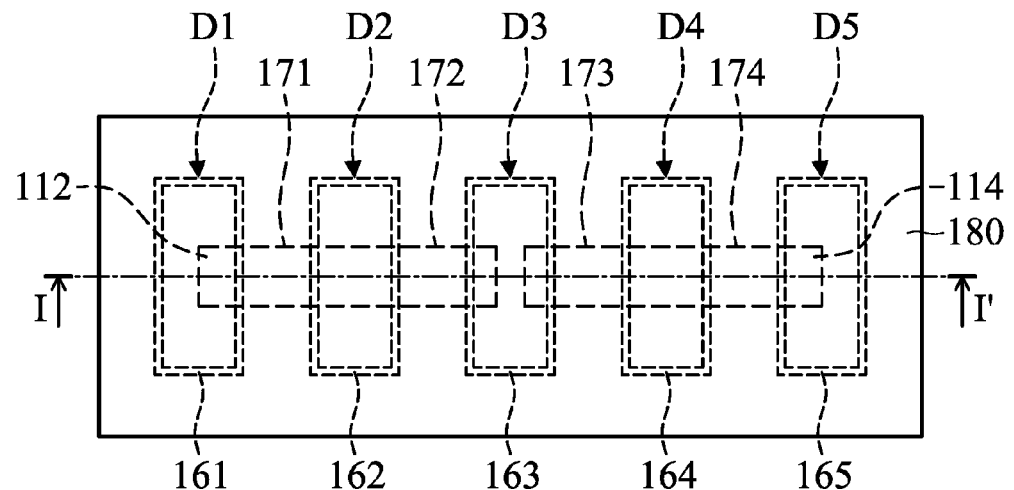
Figures 1, 1H, 2:
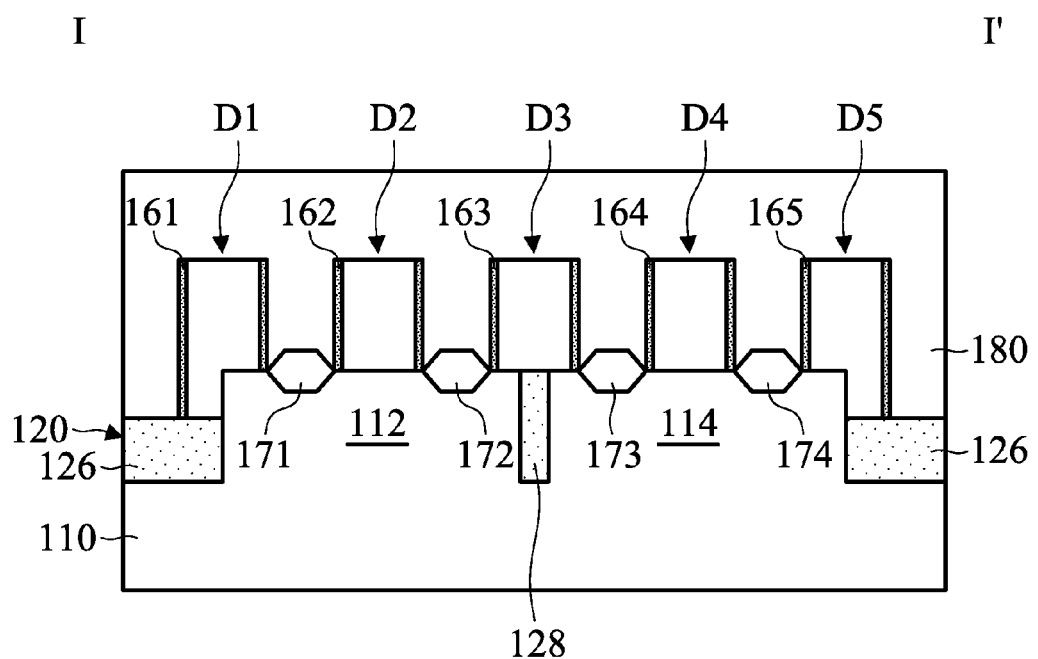
Figures 1, 1I:
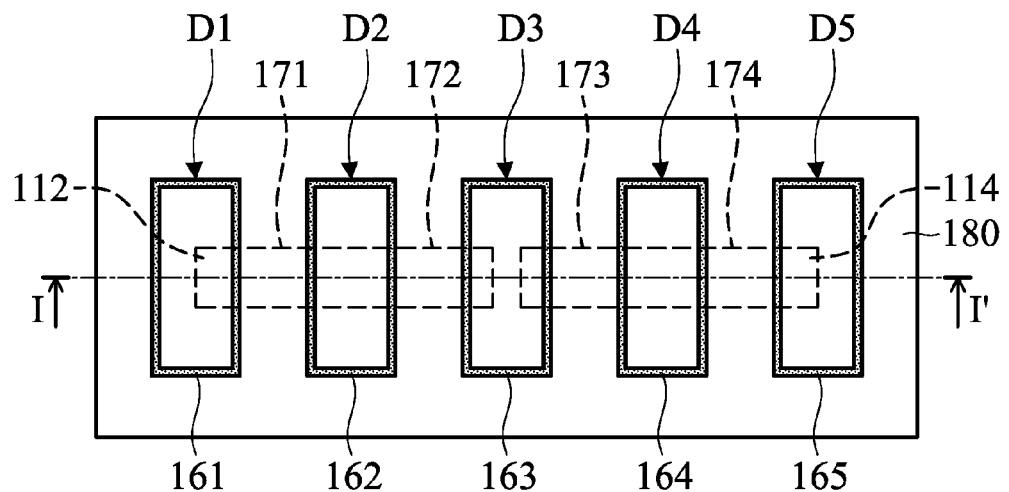
Figures 1, 1I, 2:
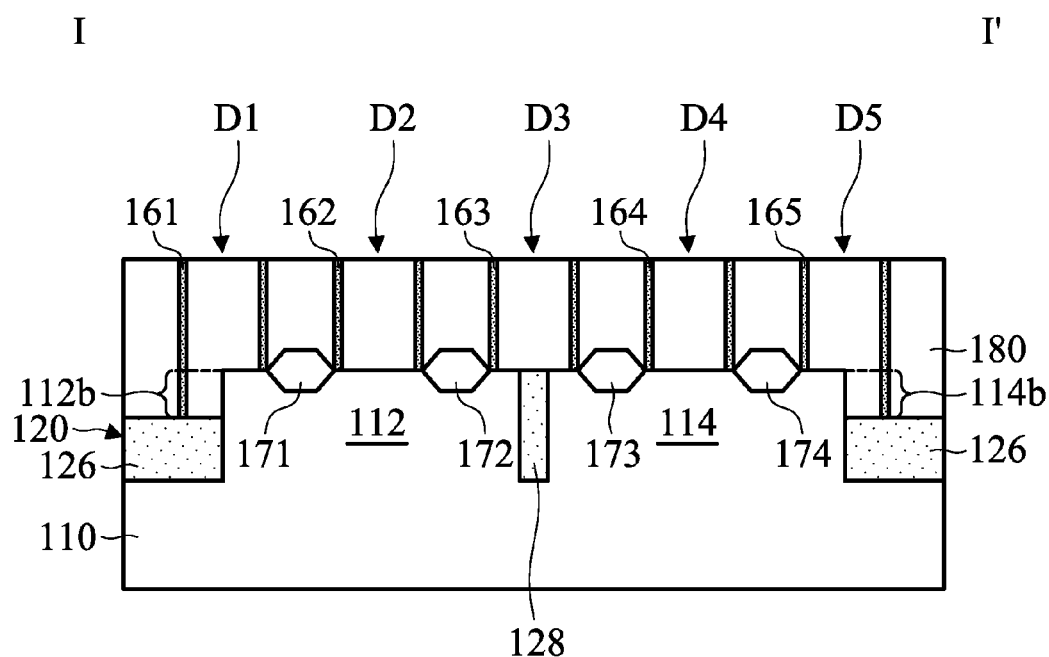
Figures 1, 1J:
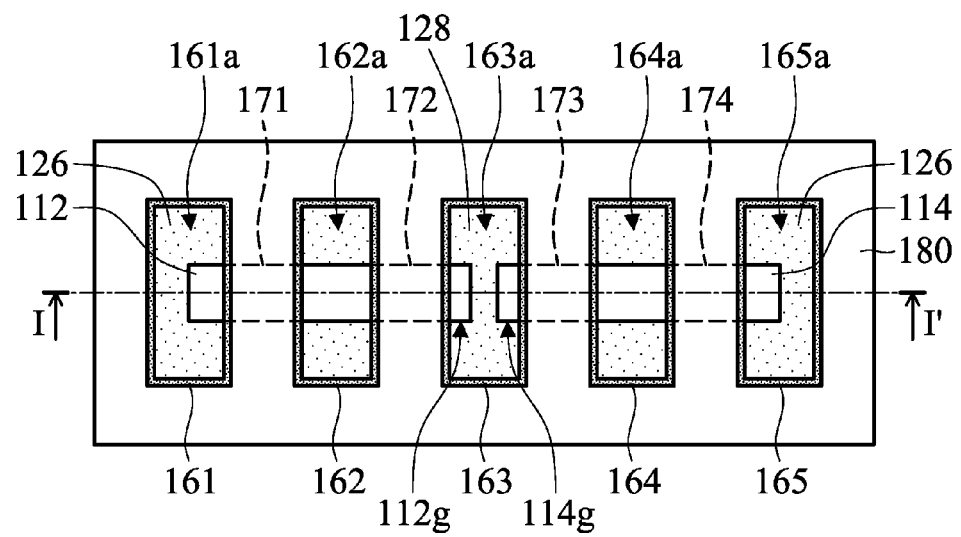
Figures 1, 1J, 2:
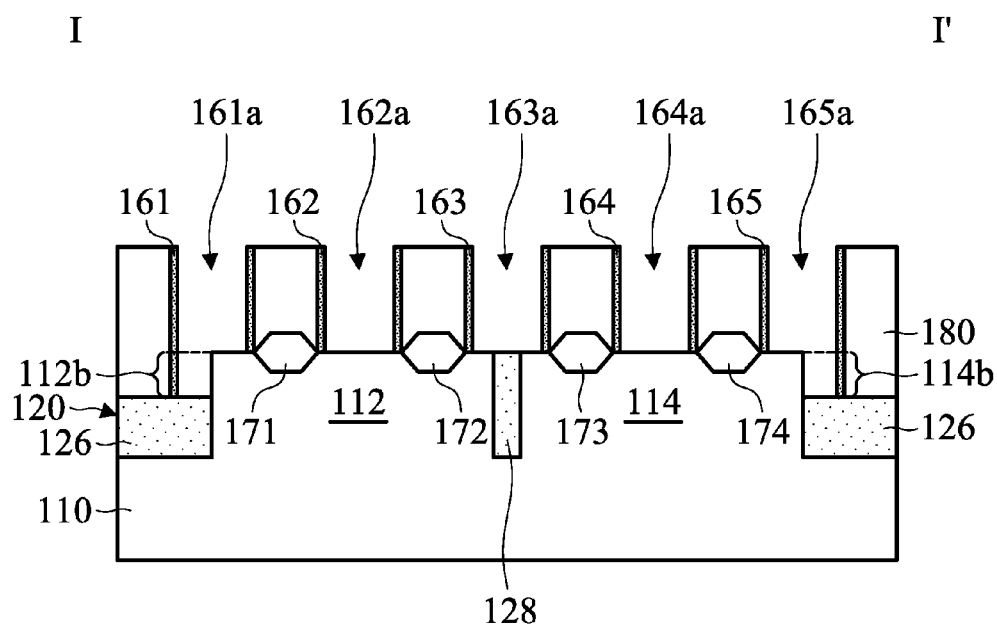
Figures 1, 1J, 2, 3:
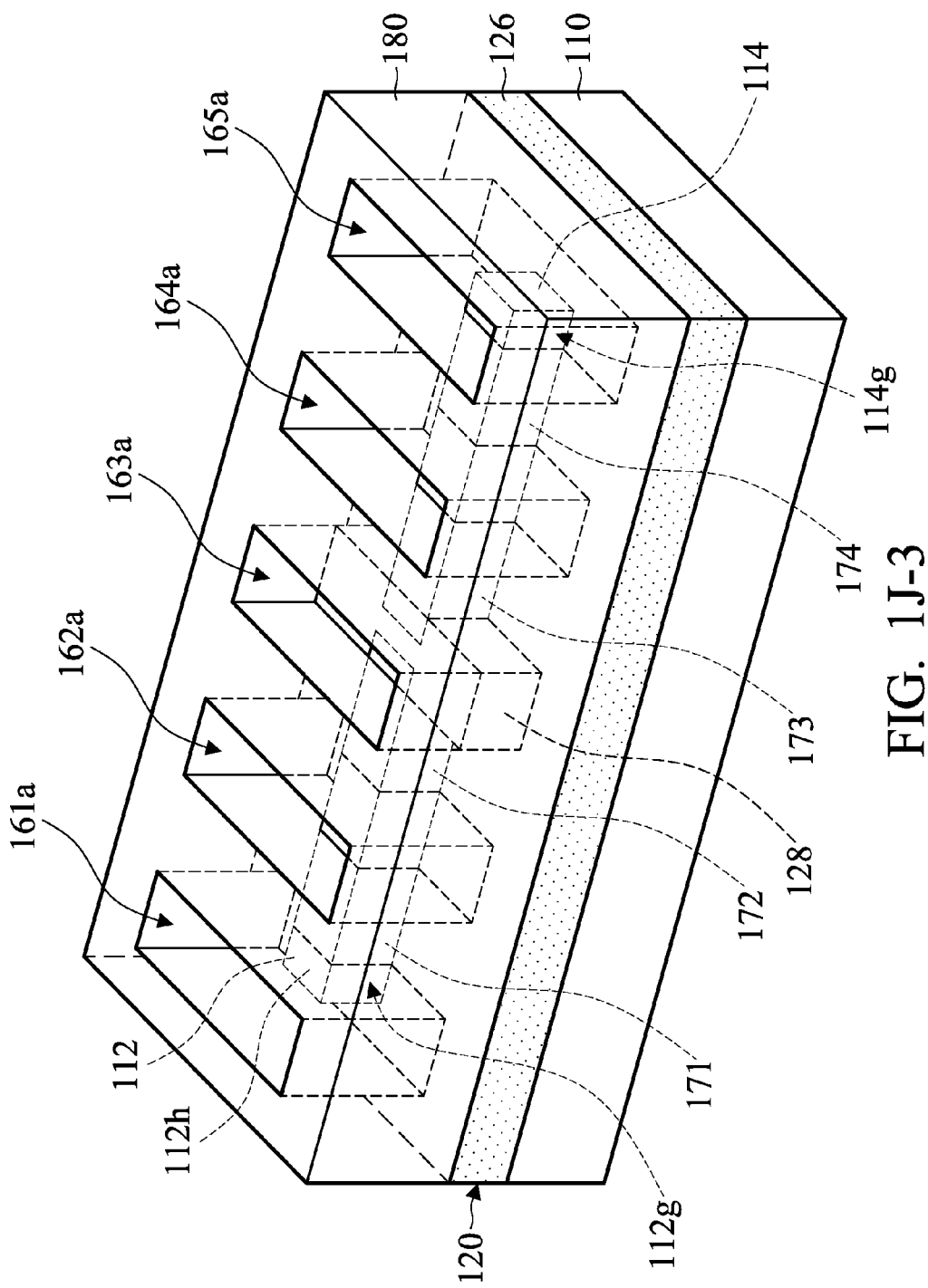
Figures 1, 1K:
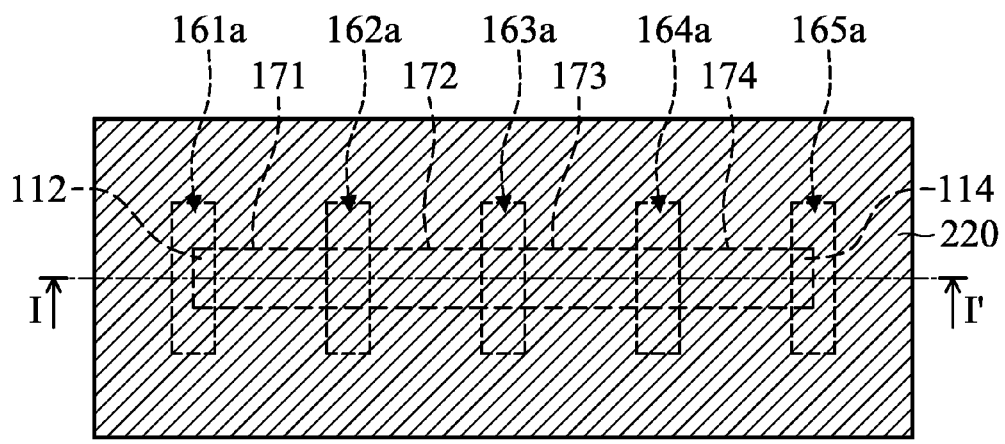
Figures 1, 1K, 2:
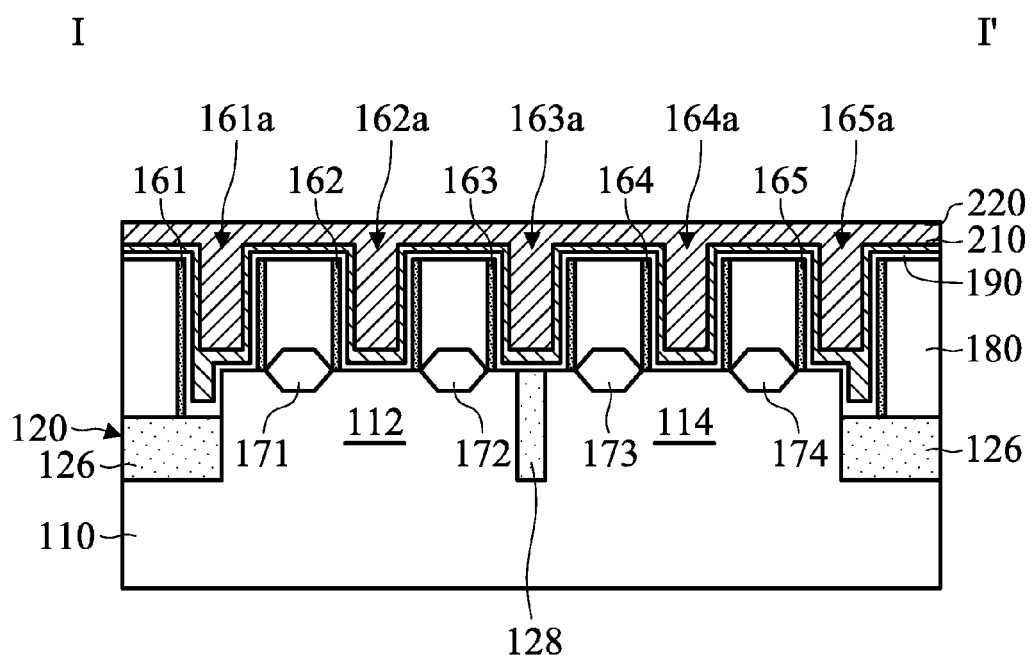
Figures 1, 1L:
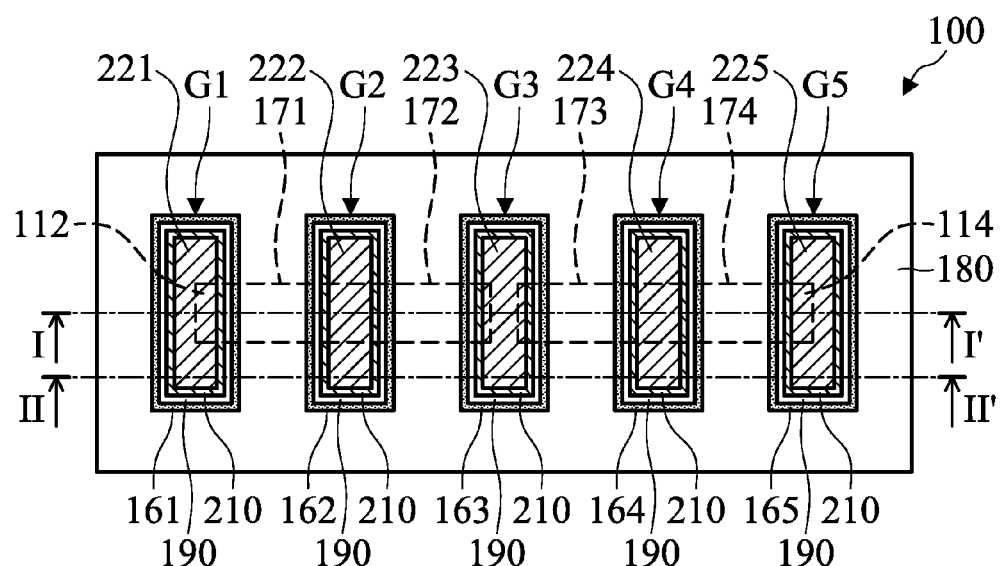
Figures 1, 1L, 2:
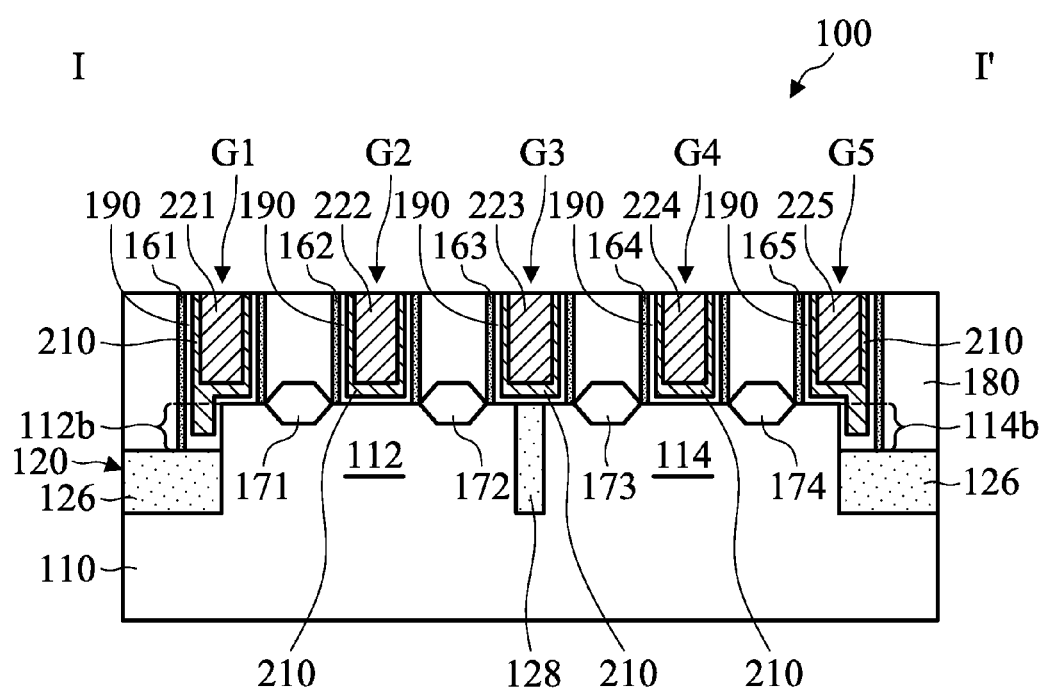
Figures 1, 1L, 2, 3:
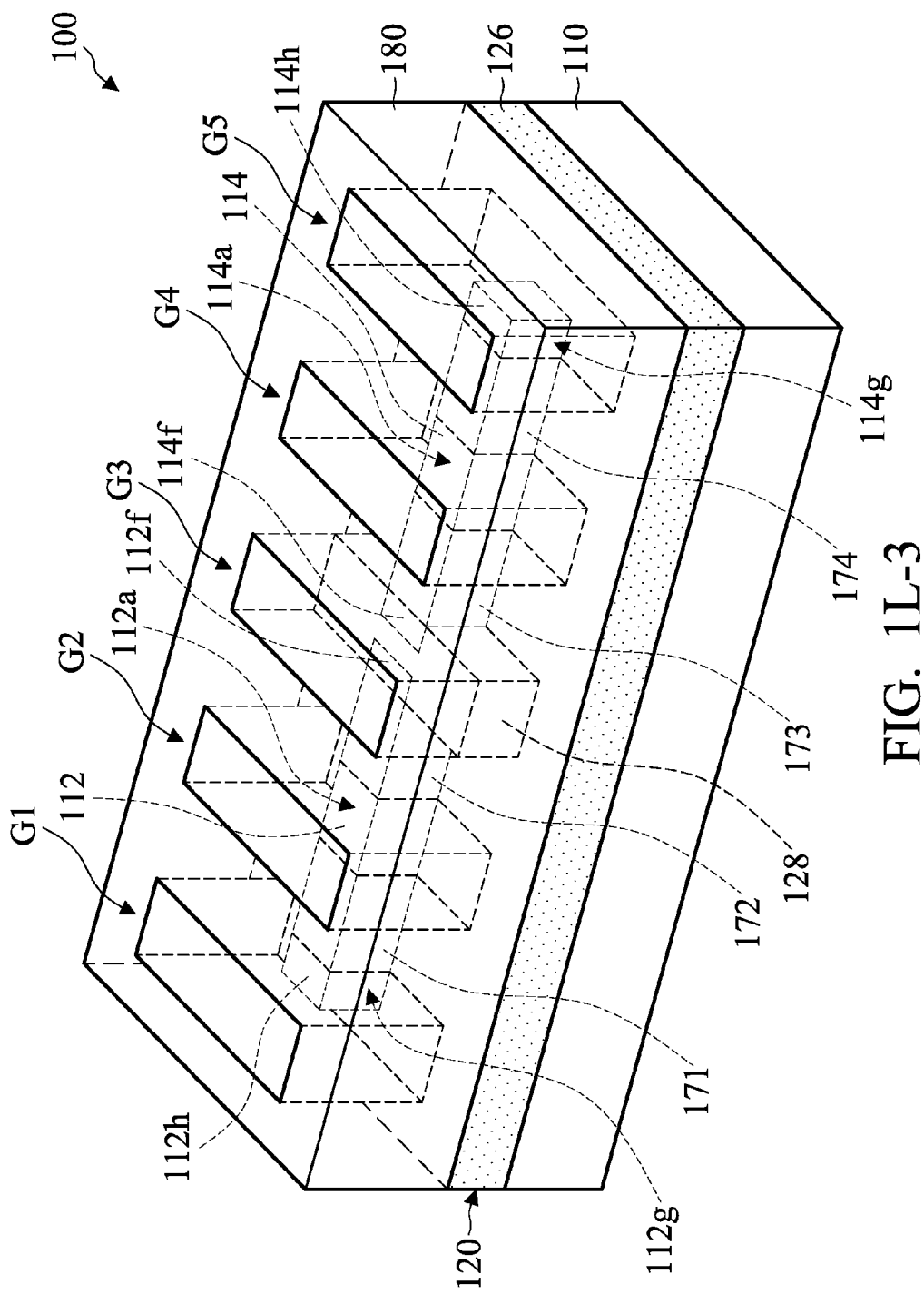
Figures 1, 1L, 2, 3, 4:
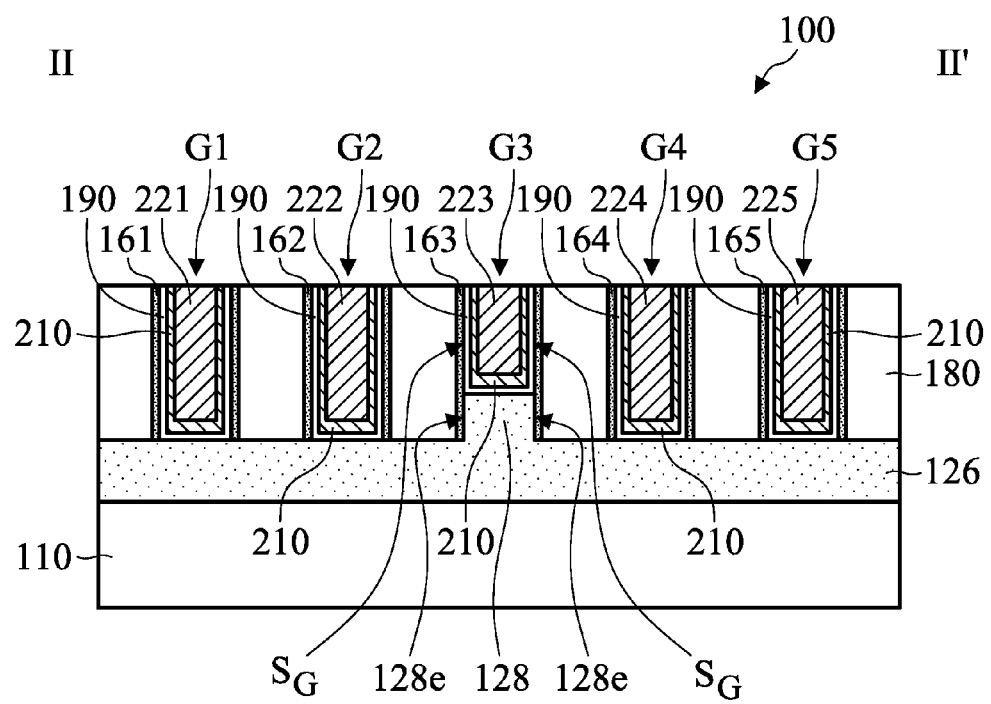

FIGS. 1A-1 to 1L-1 are top views of various stages of a process for forming a semiconductor device structure, in accordance with some embodiments. FIGS. 1A-2 to 1L-2 are cross-sectional views illustrating the semiconductor device structure along a sectional line I-I' in FIGS. 1A-1 to 1L-1, in accordance with some embodiments.

FIGS. 1C-3, 1E-3, 1J-3, and 1L-3 are perspective views of the semiconductor device structure of FIGS. 1C-1, 1E-1, 1J-1, and 1L-1, in accordance with some embodiments. FIGS. 1F-3, 1G-3, and 1L-4 are cross-sectional views illustrating the semiconductor device structure along a sectional line II-II' in FIGS. 1F-1, 1G-1, and 1L-1, in accordance with some embodiments.

As shown in FIGS. 1A-1 and 1A-2, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIGS. 1A-1 and 1A-2, fin structures 112 and 114 are formed over the substrate 110, in accordance with some embodiments. There is a gap G between the fin structures 112 and 114, in accordance with some embodiments. The gap G separates the fin structure 112 from the fin structure 114, in accordance with some embodiments.

In some embodiments, the fin structures 112 and 114 and the substrate 110 are made of the same material. The formation of the fin structures 112 and 114 includes forming a trench 116 in the substrate 110, in accordance with some embodiments. The trench 116 surrounds the fin structures 112 and 114, in accordance with some embodiments.

As shown in FIG. 1A-1, the fin structures 112 and 114 both have a rectangular shape, in accordance with some embodiments. The fin structures 112 has two opposite short sides 112*b* and 112*c* and two opposite long sides 112*d* and 112*e*, in accordance with some embodiments. Each of the short sides 112*b* and 112*c* is shorter than each of the long sides 112*d* and 112*e*, in accordance with some embodiments.

The fin structures 114 have two opposite short sides 114*b* and 114*c* and two opposite long sides 114*d* and 114*e*, in accordance with some embodiments. Each of the short sides 114b and 114c is shorter than each of the long sides 114d and 114e, in accordance with some embodiments. The short side 112b is adjacent to the short side 114b, in accordance with some embodiments. The short sides 112b and 114b are between the short sides 112c and 114c, in accordance with some embodiments.

As shown in FIGS. 1A-1 and 1A-2, an isolation structure 120 is formed over the substrate 110 and surrounds the fin structures 112 and 114, in accordance with some embodiments. The isolation structure 120 is filled in the trench 116, in accordance with some embodiments. The gap G is filled up with the isolation structure 120, in accordance with some embodiments.

In some embodiments, a top surface 122 of the isolation structure 120 and top surfaces 112a and 114a of the fin structures 112 and 114 are coplanar. The isolation structure 120 is configured to electrically insulate the fin structure 112 from the fin structure 114, in accordance with some embodiments.

The isolation structure 120 includes oxide (such as silicon oxide), in accordance with some embodiments. The isolation structure 120 is formed using a chemical vapor deposition (CVD) process, in accordance with some embodiments. The formation of the isolation structure 120 includes depositing an isolation material layer (not shown) over the substrate 110; and performing a planarization process to remove the isolation material layer outside of the trench 116, in accordance with some embodiments.

As shown in FIGS. 1B-1 and 1B-2, a mask layer 130 is formed over a first portion 124a, a second portion 124b, and a third portion 124c of the isolation structure 120, in accordance with some embodiments. The mask layer 130 is further formed over end portions 112f and 114f of the fin structures 112 and 114, in accordance with some embodiments.

The first portion 124a is in the gap G, in accordance with some embodiments. The second portion 124b and the third portion 124c are on opposite sides of the gap G, in accordance with some embodiments. The first portion 124a connects the second portion 124b to the third portion 124c, in accordance with some embodiments. The mask layer 130 includes silicon nitride, polymer, or another suitable material, which is different from that of the isolation structure 120, in accordance with some embodiments.

As shown in FIGS. 1C-1, 1C-2, and 1C-3, the isolation structure 120 exposed by the mask layer 130 is thinned, in accordance with some embodiments. The thinning process includes a dry etching process or another suitable process. After the thinning process, the isolation structure 120 has a thin portion 126 and a thick portion 128, in accordance with some embodiments. The thin portion 126 is thinner than the thick portion 128, in accordance with some embodiments. The thickness T1 of the thin portion 126 is less than the thickness T2 of the thick portion 128, in accordance with some embodiments.

The thin portion 126 is the isolation structure 120 exposed by the mask layer 130, in accordance with some embodiments. The thick portion 128 is the isolation structure 120 covered by the mask layer 130, in accordance with some embodiments. The thin portion 126 is also referred to as a thinned portion, in accordance with some embodiments. The thick portion 128 is also referred to as an unthinned portion, in accordance with some embodiments.

The thin portion 126 is over the substrate 110 and surrounding the fin structures 112 and 114, in accordance with some embodiments. In some embodiments, upper portions 112b and 114b of the fin structures 112 and 114 protrude from the thin portion 126. The thick portion 128 is partially between the upper portions 112b and 114b, in accordance with some embodiments. The top surfaces 112a and 114a of the fin structures 112 and 114 and a top surface 128a of the thick portion 128 are coplanar, in accordance with some embodiments.

The thick portion 128 is partially in the gap G, in accordance with some embodiments. The gap G is filled up with a portion of the thick portion 128, in accordance with some embodiments. The thick portion 128 has an I-like shape, in accordance with some embodiments. The thick portion 128 has a first end portion 128b, a second end portion 128c, and a connecting portion 128d, in accordance with some embodiments. The connecting portion 128d connects the first end portion 128b to the second end portion 128c, in accordance with some embodiments.

Each of the first end portion 128b and the second end portion 128c is wider than the connecting portion 128d, in accordance with some embodiments. That is, the width W1 of the first end portion 128b or the second end portion 128c is greater than the width W2 of the connecting portion 128d, in accordance with some embodiments. The gap G is filled up with the connecting portion 128d, in accordance with some embodiments. As shown in FIGS. 1C-1 and 1C-2, the mask layer 130 is removed, in accordance with some embodiments.

As shown in FIGS. 1D-1 and 1D-2, a gate dielectric layer 140 is formed over the fin structures 112 and 114 and the isolation structure 120, in accordance with some embodiments. The gate dielectric layer 140 includes silicon oxide or another suitable dielectric material. As shown in FIGS. 1D-1 and 1D-2, a gate electrode layer 150 is formed over the gate dielectric layer 140, in accordance with some embodiments. The gate electrode layer 150 includes polysilicon or another suitable conductive material.

As shown in FIGS. 1E-1, 1E-2, and 1E-3, portions of the gate dielectric layer 140 and the gate electrode layer 150 are removed, in accordance with some embodiments. After the removal process, the remaining gate dielectric layer 140 and the remaining gate electrode layer 150 together form dummy gate stacks D1, D2, D3, D4, and D5, in accordance with some embodiments.

The dummy gate stack D1 includes a dummy gate dielectric layer 141 and a dummy gate electrode 151 thereon, in accordance with some embodiments. The dummy gate stack D1 is formed over the fin structure 112 and the thinned portion 126, in accordance with some embodiments. The dummy gate stack D1 covers the top surface 112a and sidewalls 112g of the fin structure 112, in accordance with some embodiments. The dummy gate stack D1 is formed over an end portion 112h of the fin structure 112, in accordance with some embodiments.

The dummy gate stack D2 includes a dummy gate dielectric layer 142 and a dummy gate electrode 152 thereon, in accordance with some embodiments. The dummy gate stack D2 is formed over the fin structure 112 and the thinned portion 126, in accordance with some embodiments. The dummy gate stack D2 covers the top surface 112a and the sidewalls 112g of the fin structure 112, in accordance with some embodiments.

The dummy gate stack D3 includes a dummy gate dielectric layer 143 and a dummy gate electrode 153 thereon, in accordance with some embodiments. The dummy gate stack D3 is formed over the thick portion 128 and the top surfaces 112a and 114a of the fin structures 112 and 114, in accordance with some embodiments. The dummy gate stack D3 is formed over the end portions 112*f* and 114*f* of the fin structures 112 and 114, in accordance with some embodiments.

The dummy gate stack D4 includes a dummy gate dielectric layer 144 and a dummy gate electrode 154 thereon, in accordance with some embodiments. The dummy gate stack D4 is formed over the fin structure 114 and the thinned portion 126, in accordance with some embodiments. The dummy gate stack D4 covers the top surface 114*a* and the sidewalls 114*g* of the fin structure 114, in accordance with some embodiments.

The dummy gate stack D5 includes a dummy gate dielectric layer 145 and a dummy gate electrode 155 thereon, in accordance with some embodiments. The dummy gate stack D5 is formed over the fin structure 114 and the thinned portion 126, in accordance with some embodiments. The dummy gate stack D5 covers the top surface 114*a* and sidewalls 114*g* of the fin structure 114, in accordance with some embodiments. The dummy gate stack D5 is formed over an end portion 114*h* of the fin structure 114, in accordance with some embodiments.

As shown in FIGS. 1F-1, 1F-2, and 1F-3, a spacer layer 160 is deposited over the dummy gate stacks D1, D2, D3, D4, and D5, the fin structures 112 and 114, the isolation structure 120, and the substrate 110, in accordance with some embodiments. As shown in FIG. 1F-3, the spacer layer 160 covers sidewalls 128*e* of the thick portion 128, in accordance with some embodiments. The spacer layer 160 includes insulating materials, such as silicon oxide or silicon nitride, in accordance with some embodiments.

As shown in FIGS. 1G-1, 1G-2, and 1G-3, the spacer layer 160 on the fin structures 112 and 114, the substrate 110, and top surfaces of the dummy gate stacks D1, D2, D3, D4, and D5 is removed, in accordance with some embodiments. The removal process includes an anisotropic etching process, in accordance with some embodiments. After the removal process, the remaining spacer layer 160 has spacers 161, 162, 163, 164, and 165, in accordance with some embodiments.

The spacers 161, 162, 163, 164, and 165 surround the dummy gate stacks D1, D2, D3, D4, and D5, respectively, in accordance with some embodiments. As shown in FIG. 1G-3, the spacer 163 further surrounds the thick portion 128, in accordance with some embodiments. The spacer 163 covers the sidewalls 128*e* of the thick portion 128, in accordance with some embodiments.

As shown in FIGS. 1G-1 and 1G-2, portions of the fin structures 112 and 114 are removed to form recesses 112*i* and 112*j* in the fin structure 112 and recesses 114*i* and 114*j* in the fin structure 114, in accordance with some embodiments. The removal process includes a dry etching process, in accordance with some embodiments.

As shown in FIGS. 1G-1 and 1G-2, stressors 171, 172, 173, and 174 are formed in the recesses 112*i*, 112*j*, 114*i*, and 114*j*, respectively, in accordance with some embodiments. The stressors 171 and 172 are partially embedded in the fin structure 112, in accordance with some embodiments. The stressors 173 and 174 are partially embedded in the fin structure 114, in accordance with some embodiments.

In some other embodiments, the stressors 150 include an n-type semiconductor material. The stressors 171, 172, 173, and 174 may include epitaxially grown silicon, epitaxially grown silicon carbide (SiC), epitaxially grown silicon phosphide (SiP), or another suitable epitaxially grown semiconductor material.

In some embodiments, the stressors 171, 172, 173, and 174 include a p-type semiconductor material. For example, the stressors 171, 172, 173, and 174 may include epitaxially grown silicon germanium. The stressors 171 and 172 are also referred to as a source structure and a drain structure, in accordance with some embodiments. The stressors 173 and 174 are also referred to as a source structure and a drain structure, in accordance with some embodiments.

In some embodiments, the stressors 171, 172, 173, and 174 are formed by using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the stressors 171, 172, 173, and 174 may use gaseous and/or liquid precursors, which may interact with the substrate 110.

In some embodiments, the stressors 171, 172, 173, and 174 are doped with one or more suitable dopants. For example, the stressors 171, 172, 173, and 174 are n-type source/drain features doped with phosphor (P), antimony (Sb), or another suitable dopant. Alternatively, the stressors 171, 172, 173, and 174 are p-type source/drain features doped with boron (B) or another suitable dopant. In some embodiments, the stressors 171, 172, 173, and 174 are doped in-situ during the growth of the stressors 171, 172, 173, and 174.

In some other embodiments, the stressors 171, 172, 173, and 174 are not doped during the growth of the stressors 171, 172, 173, and 174. After the formation of the stressors 171, 172, 173, and 174, the stressors 171, 172, 173, and 174 are doped in a subsequent process.

In some embodiments, the doping is achieved by using an ion implantation process, a plasma immersion ion implantation process, a gas and/or solid source diffusion process, another applicable process, or a combination thereof. In some embodiments, the stressors 171, 172, 173, and 174 are further exposed to annealing processes to activate the dopants. For example, a rapid thermal annealing process is performed.

As shown in FIGS. 1H-1 and 1H-2, an insulating layer 180 is formed over the substrate 110, the fin structures 112 and 114, the isolation structure 120, the gate stacks D1, D2, D3, D4, and D5, and the spacers 161, 162, 163, 164, and 165, in accordance with some embodiments.

The insulating layer 180 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The insulating layer 180 is deposited by any suitable process, such as a CVD process, HDPCVD process, spin-on process, sputtering process, or a combination thereof.

As shown in FIGS. 1I-1 and 1I-2, a planarization process is then performed on the insulating layer 180 until the top surfaces of the gate stacks D1, D2, D3, D4, and D5 are exposed, in accordance with some embodiments. The planarization process includes a chemical mechanical polishing (CMP) process, in accordance with some embodiments.

As shown in FIGS. 1J-1, 1J-2, and 1J-3, the gate stacks D1, D2, D3, D4, and D5 are removed, in accordance with some embodiments. The removal process includes a wet etching process, in accordance with some embodiments. After the removal process, openings 161*a*, 162*a*, 163*a*, 164*a*, and 165*a* are formed in the spacers 161, 162, 163, 164, and 165, respectively, in accordance with some embodiments. It should be noted that for the sake of simplicity, the spacers 161, 162, 163, 164, and 165 are omitted in FIG. 1J-3, in accordance with some embodiments.

Since the formation of the thick portion 128 of the isolation structure 120, the gap G is filled up with the thick portion 128. The dummy gate stack D3 is formed over a substantially planar surface composed of the thick portion 128 and the fin structures 112 and 114, and therefore the dummy gate stack D3 is formed without a footing structure (or a footing profile), in accordance with some embodiments.

The footing structure may cause the etchant used in the dummy gate stack removal process to pass through the spacer 163 and damage the stressors 172 and 173. As a result, the formation of the thick portion 128 prevents the etchant used in the dummy gate stack removal process from damaging the stressors 172 and 173, in accordance with some embodiments. Therefore, the yield of the dummy gate stack removal process is improved, in accordance with some embodiments.

Furthermore, the formation of the thick portion 128 prevents the dummy gate stack D3 from extending onto the sidewalls 112g and 114g of the fin structures 112 and 114, in accordance with some embodiments. Therefore, the formation of the thick portion 128 prevents the stressors 172 and 173 adjacent to the sidewalls 112g and 114g from being damaged by the etchant used in the dummy gate stack removal process, in accordance with some embodiments.

As shown in FIGS. 1K-1 and 1K-2, a gate dielectric layer 190 is formed to cover bottom surfaces of the opening 161a, 162a, 163a, 164a, and 165a, in accordance with some embodiments. The gate dielectric layer 190 is made of a dielectric material, such as a high dielectric constant (high-k) material, in accordance with some embodiments.

The high-k material is made of hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or a combination thereof.

The gate dielectric layer 190 is deposited by any suitable process, such as atomic layer deposition (ALD), chemical vapor deposition (CVD), physical vapor deposition (PVD), sputtering, plating, other suitable processes, or a combination thereof. In some embodiments, the gate dielectric layer 190 needs to be further annealed.

As shown in FIGS. 1K-1 and 1K-2, a work function metal layer 210 is deposited over the gate dielectric layer 190, in accordance with some embodiments. The work function metal layer 210 provides a desired work function for transistors to enhance device performance including improved threshold voltage.

In the embodiments of forming an NMOS transistor, the work function metal layer 210 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 210 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

The work function metal layer 210 may also be made of hafnium, zirconium, titanium, tantalum, aluminum, metal carbides (e.g., hafnium carbide, or zirconium carbide), aluminides, ruthenium or a combination thereof. The work function metal layer 210 may be deposited by using a PVD process, CVD process, ALD process, plating process, another suitable method, or a combination thereof.

As shown in FIGS. 1K-1 and 1K-2, a gate electrode layer 220 (also called a metal gate electrode layer) is deposited over the work function metal layer 210 to fill the opening 161a, 162a, 163a, 164a, and 165a, in accordance with some embodiments. The gate electrode layer 220 is made of a suitable metal material, such as aluminum, tungsten, gold, platinum, cobalt, other suitable metal, an alloy thereof, or a combination thereof, in accordance with some embodiments.

As shown in FIGS. 1L-1, 1L-2, and 1L-3, a planarization process is performed to remove the gate electrode layer 220, the work function metal layer 210, and the gate dielectric layer 190 outside of the opening 161a, 162a, 163a, 164a, and 165a, in accordance with some embodiments. It should be noted that for the sake of simplicity, the spacers 161, 162, 163, 164, and 165 are omitted in FIG. 1L-3, in accordance with some embodiments.

In this step, a semiconductor device structure 100 is formed, in accordance with some embodiments. The semiconductor device structure 100 includes a fin field effect transistor (fin FET), in accordance with some embodiments. In the semiconductor device structure 100, the gate electrode layer 220, the work function metal layer 210, and the gate dielectric layer 190 remaining in the opening 161a, 162a, 163a, 164a, and 165a respectively form a dummy gate stack G1, a gate stack G2, a dummy gate stack G3, and a gate stack G4, and a dummy gate stack G5, in accordance with some embodiments.

The dummy gate stacks G1, G3, and G5 and the gate stacks G2 and G4 are also referred to as metal gate stacks, in accordance with some embodiments. The gate electrode layer 220 remaining in the opening 161a, 162a, 163a, 164a, and 165a includes a dummy gate electrode 221, a gate electrode 222, a dummy gate electrode 223, a gate electrode 224, and a dummy gate electrode 225, in accordance with some embodiments.

The dummy gate stack G1 includes the gate dielectric layer 190, the work function metal layer 210, and the dummy gate electrode 221, in accordance with some embodiments. The dummy gate stack G1 is formed over the fin structure 112 and the thinned portion 126, in accordance with some embodiments. The dummy gate stack G1 covers the top surface 112a and sidewalls 112g of the fin structure 112, in accordance with some embodiments. The dummy gate stack G1 is formed over an end portion 112h of the fin structure 112, in accordance with some embodiments.

The gate stack G2 includes the gate dielectric layer 190, the work function metal layer 210, and the gate electrode 222, in accordance with some embodiments. The dummy gate stack G2 is formed over the fin structure 112 and the thinned portion 126, in accordance with some embodiments.

The dummy gate stack G2 covers the top surface 112a and the sidewalls 112g of the fin structure 112, in accordance with some embodiments.

The dummy gate stack G3 includes the gate dielectric layer 190, the work function metal layer 210, and the dummy gate electrode 223, in accordance with some embodiments. The dummy gate stack G3 is formed over the thick portion 128 and the top surfaces 112a and 114a of the fin structures 112 and 114, in accordance with some embodiments. The dummy gate stack G3 is formed over the end portions 112f and 114f of the fin structures 112 and 114, in accordance with some embodiments.

The gate stack G4 includes the gate dielectric layer 190, the work function metal layer 210, and the gate electrode 224, in accordance with some embodiments. The dummy gate stack G4 is formed over the fin structure 114 and the thinned portion 126, in accordance with some embodiments. The dummy gate stack G4 covers the top surface 114a and the sidewalls 114g of the fin structure 114, in accordance with some embodiments.

The dummy gate stack G5 includes the gate dielectric layer 190, the work function metal layer 210, and the dummy gate electrode 225, in accordance with some embodiments. The dummy gate stack G5 is formed over the fin structure 114 and the thinned portion 126, in accordance with some embodiments. The dummy gate stack G5 covers the top surface 114a and sidewalls 114g of the fin structure 114, in accordance with some embodiments. The dummy gate stack G5 is formed over an end portion 114h of the fin structure 114, in accordance with some embodiments.

The entire dummy gate electrode 223 is over the thick portion 228, a portion of the upper portion 112b of the fin structure 112, and a portion of the upper portion 114b of the fin structure 114, in accordance with some embodiments. The entire dummy gate electrode 223 is over the top surface 112a of the fin structure 112, the top surface 114a of the fin structure 114, and the top surface 128a of the thick portion 228, which are coplanar, in accordance with some embodiments.

The dummy gate electrode 223 does not cover the sidewalls 112g of the fin structure 112 and the sidewalls 114g of the fin structure 114, in accordance with some embodiments. The gate electrode 222 covers the top surface 112a and the sidewalls 112g of the fin structure 112, in accordance with some embodiments.

The gate electrode 224 covers the top surface 114a and the sidewalls 114g of the fin structure 114, in accordance with some embodiments. The spacers 161, 163, 165, 162, and 164 surround the dummy gate stacks G1, G3, and G5 and the gate stacks G2 and G4, respectively, in accordance with some embodiments.

As shown in FIG. 1L-4, the spacer 163 further surrounds the thick portion 128, in accordance with some embodiments. The spacer 163 covers the sidewalls 128e of the thick portion 128, in accordance with some embodiments. The spacer 163 is formed over the sidewalls 128e of the thick portion 128 and the sidewalls $S_G$ of the gate stack G3, in accordance with some embodiments. In some embodiments, the sidewall $S_G$ of the gate stack G3 is aligned with the sidewall 128e of the thick portion 128.

In accordance with some embodiments, semiconductor device structures and methods for forming the same are provided. The methods (for forming the semiconductor device structure) form an isolation structure with different thicknesses in a fin field effect transistor. A thick portion of the isolation structure fills up a gap between two fin structures, and therefore a dummy gate electrode formed over the thick portion and the fin structures is prevented from forming with a footing structure (or a footing profile). Therefore, stressors adjacent to the dummy gate electrode are prevented from being damaged during the removal of the dummy gate electrode. Therefore, the yield of the semiconductor device structures is improved.

In accordance with some embodiments, a semiconductor device structure is provided. The semiconductor device structure includes a substrate. The semiconductor device structure includes a first fin structure and a second fin structure over the substrate. There is a gap between the first fin structure and the second fin structure. The semiconductor device structure includes an isolation structure having a thin portion and a thick portion. The thin portion is thinner than the thick portion. The thin portion is over the substrate. A first upper portion of the first fin structure and a second upper portion of the second fin structure protrude from the thin portion. The thick portion is partially between the first upper portion and the second upper portion. The semiconductor device structure includes a dummy gate electrode over the thick portion, the first upper portion, and the second upper portion. The semiconductor device structure includes a gate electrode over the first fin structure and the thin portion.

In accordance with some embodiments, a semiconductor device structure is provided. The semiconductor device structure includes a substrate. The semiconductor device structure includes a first fin structure and a second fin structure over the substrate. There is a gap separating the first fin structure from the second fin structure. The semiconductor device structure includes an isolation structure having a thin portion and a thick portion. The thin portion is thinner than the thick portion. The thin portion is over the substrate and surrounding the first fin structure and the second fin structure. A first upper portion of the first fin structure and a second upper portion of the second fin structure protrude from the thin portion. The thick portion is partially in the gap. The semiconductor device structure includes a dummy gate electrode over the thick portion, the first upper portion, and the second upper portion. The semiconductor device structure includes a gate electrode over the first fin structure and the thin portion.

In accordance with some embodiments, a method for forming a semiconductor device structure is provided. The method includes forming a first fin structure and a second fin structure over a substrate. There is a gap between the first fin structure and the second fin structure. The method includes forming an isolation structure over the substrate and surrounding the first fin structure and the second fin structure. The method includes forming a mask layer over a first portion, a second portion, and a third portion of the isolation structure. The first portion is in the gap. The second portion and the third portion are on opposite sides of the gap. The method includes thinning the isolation structure exposed by the mask layer to form a thinned portion and an unthinned portion of the isolation structure. The method includes removing the mask layer. The method includes forming a first dummy gate electrode and a second dummy gate electrode. The first dummy gate electrode is formed over the unthinned portion, a first top surface of the first fin structure, and a second top surface of the second fin structure. The second dummy gate electrode is formed over the first fin structure and the thinned portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a first fin structure and a second fin structure over the substrate, wherein there is a gap between the first fin structure and the second fin structure, and the first fin structure has a first sidewall facing away from the second fin structure;
an isolation structure having a thin portion and a thick portion, wherein the thin portion is thinner than the thick portion, the thin portion is over the substrate, a first upper portion of the first fin structure and a second upper portion of the second fin structure protrude from the thin portion, and the thick portion is partially between the first upper portion and the second upper portion;
a first dummy gate electrode over the thick portion, the first upper portion, and the second upper portion;
a gate electrode over the first fin structure and the thin portion; and
a second dummy gate electrode over the first fin structure and the thin portion, wherein the gate electrode is between the first dummy gate electrode and the second dummy gate electrode, and the second dummy gate electrode covers the first sidewall of the first fin structure.

2. The semiconductor device structure as claimed in claim 1, wherein a first top surface of the first fin structure, a second top surface of the second fin structure, and a third top surface of the thick portion are coplanar.

3. The semiconductor device structure as claimed in claim 1, wherein the thick portion has a first end portion, a second end portion, and a connecting portion, the connecting portion connects the first end portion to the second end portion, each of the first end portion and the second end portion is wider than the connecting portion, and the gap is filled up with the connecting portion.

4. The semiconductor device structure as claimed in claim 1, wherein the first fin structure extends into the second dummy gate electrode.

5. The semiconductor device structure as claimed in claim 1, wherein the entire first dummy gate electrode is over the thick portion, a first portion of the first upper portion, and a second portion of the second upper portion.

6. The semiconductor device structure as claimed in claim 1, wherein the entire first dummy gate electrode is over a first top surface of the first fin structure, a second top surface of the second fin structure, and a third top surface of the thick portion, and the first top surface, the second top surface, and the third top surface are coplanar.

7. The semiconductor device structure as claimed in claim 6, wherein the first dummy gate electrode does not cover second sidewalls of the first fin structure and third sidewalls of the second fin structure, the gate electrode covers the first top surface and the second sidewalls of the first fin structure, and the second dummy gate electrode covers the first top surface and the second sidewalls of the first fin structure.

8. The semiconductor device structure as claimed in claim 1, wherein a first top surface of the first fin structure, a second top surface of the second fin structure, and a third top surface of the thick portion are coplanar, the first dummy gate electrode has a first lower surface facing the third top surface of the thick portion, the gate electrode has a second lower surface facing the first top surface of the first fin structure, the second dummy gate electrode has a third lower surface facing the first top surface of the first fin structure, and the first lower surface, the second lower surface, and the third lower surface are coplanar.

9. A semiconductor device structure, comprising:
a substrate;
a first fin structure and a second fin structure over the substrate, wherein there is a gap separating the first fin structure from the second fin structure, and the first fin structure has a first sidewall facing away from the second fin structure;
an isolation structure having a thin portion and a thick portion, wherein the thin portion is thinner than the thick portion, the thin portion is over the substrate and surrounding the first fin structure and the second fin structure, a first upper portion of the first fin structure and a second upper portion of the second fin structure protrude from the thin portion, and the thick portion is partially in the gap;
a first dummy gate electrode over the thick portion, the first upper portion, and the second upper portion;
a gate electrode over the first fin structure and the thin portion; and
a second dummy gate electrode over the first fin structure and the thin portion, wherein the gate electrode is between the first dummy gate electrode and the second dummy gate electrode, and the second dummy gate electrode covers the first sidewall of the first fin structure.

10. The semiconductor device structure as claimed in claim 9, further comprising:
a first stressor and a second stressor on opposite sides of the gate electrode and both partially embedded in the first fin structure.

11. The semiconductor device structure as claimed in claim 9, wherein the thick portion has an I-like shape.

12. The semiconductor device structure as claimed in claim 9, wherein the gap is filled up with a portion of the thick portion.

13. The semiconductor device structure as claimed in claim 9, wherein the entire first dummy gate electrode is over the entire thick portion, a first portion of the first upper portion, and a second portion of the second upper portion.

14. The semiconductor device structure as claimed in claim 9, wherein the entire first dummy gate electrode is over a first top surface of the first fin structure, a second top surface of the second fin structure, and a third top surface of the thick portion, and the first top surface, the second top surface, and the third top surface are coplanar.

15. The semiconductor device structure as claimed in claim 14, wherein the first dummy gate electrode does not cover second sidewalls of the first fin structure and third sidewalls of the second fin structure.

16. A semiconductor device structure, comprising:
a substrate;
a first fin structure and a second fin structure over the substrate, wherein there is a gap separating the first fin structure from the second fin structure, and the first fin structure has a first sidewall facing away from the second fin structure;

an isolation structure having a thin portion and a thick portion, wherein the thin portion is thinner than the thick portion, the thin portion is over the substrate and surrounding the first fin structure and the second fin structure, a first upper portion of the first fin structure and a second upper portion of the second fin structure protrude from the thin portion, and the thick portion is partially in the gap;

a first dummy gate electrode over the thick portion, the first upper portion, and the second upper portion;

a first gate electrode over the first fin structure and the thin portion;

a second gate electrode over the second fin structure and the thin portion, wherein the first dummy gate electrode is between the first gate electrode and the second gate electrode; and a second dummy gate electrode over the first fin structure and the thin portion, wherein the first gate electrode is between the first dummy gate electrode and the second dummy gate electrode, and the second dummy gate electrode covers the first sidewall of the first fin structure.

17. The semiconductor device structure as claimed in claim 16, wherein the thick portion in the gap is narrower than the thick portion outside of the gap.

18. The semiconductor device structure as claimed in claim 16, wherein the first dummy gate electrode does not cover second sidewalls of the first fin structure and third sidewalls of the second fin structure.

19. The semiconductor device structure as claimed in claim 18, wherein the thick portion covers the second sidewalls of the first fin structure and the third sidewalls of the second fin structure.

20. The semiconductor device structure as claimed in claim 16, further comprising:

a first stressor and a second stressor partially embedded in the first fin structure, wherein the first gate electrode is between the first stressor and the second stressor; and a third stressor and a fourth stressor partially embedded in the second fin structure, wherein the second gate electrode is between the third stressor and the fourth stressor, and the first dummy gate electrode is between the second stressor and the third stressor.

* * * * *